(12) United States Patent
Bellorado et al.

(10) Patent No.: US 9,570,198 B2
(45) Date of Patent: Feb. 14, 2017

(54) READ DISTURB DETECTION

(71) Applicant: SK Hynix Inc., Gyeonggi-do (KR)

(72) Inventors: Jason Bellorado, San Jose, CA (US); Zheng Wu, San Jose, CA (US); Lingqi Zeng, San Jose, CA (US)

(73) Assignee: SK Hynix Inc., Gyeonggi-do (KR)

(*) Notice: Subject to any disclaimer, the term of this patent is extended or adjusted under 35 U.S.C. 154(b) by 115 days.

(21) Appl. No.: 14/602,151

(22) Filed: Jan. 21, 2015

(65) Prior Publication Data

US 2015/0332788 A1 Nov. 19, 2015

Related U.S. Application Data

(60) Provisional application No. 61/994,691, filed on May 16, 2014.

(51) Int. Cl.
| | |
|---|---|
| *G11C 29/00* | (2006.01) |
| *G11C 29/42* | (2006.01) |
| *G11C 29/36* | (2006.01) |
| *G11C 11/56* | (2006.01) |
| *G11C 29/52* | (2006.01) |

(52) U.S. Cl.
CPC .......... *G11C 29/42* (2013.01); *G11C 11/5642* (2013.01); *G11C 29/36* (2013.01); *G11C 29/52* (2013.01)

(58) Field of Classification Search
CPC ................. G11C 29/42; G11C 29/36
See application file for complete search history.

(56) References Cited

U.S. PATENT DOCUMENTS

| | | | |
|---|---|---|---|
| 7,818,525 B1 | 10/2010 | Frost et al. | |
| 2008/0158971 A1 | 7/2008 | Lee | |
| 2008/0288814 A1* | 11/2008 | Kitahara | G06F 11/073 714/5.1 |
| 2010/0122148 A1* | 5/2010 | Flynn | G06F 11/108 714/773 |
| 2012/0030506 A1 | 2/2012 | Post et al. | |
| 2015/0067415 A1* | 3/2015 | Miyamoto | G06F 11/073 714/704 |

* cited by examiner

*Primary Examiner* — April Y Blair
*Assistant Examiner* — Thien D Nguyen
(74) *Attorney, Agent, or Firm* — IP & T Group LLP (57) ABSTRACT

It is determined that a read count has reached one of a set of read count thresholds. An initial test page which corresponds to the read count threshold that has been reached is selected from a set of initial test pages. There is at least one page that is not in the set of initial test pages and is victimized by an offending page that also victimizes a page in the set of initial test pages. A test read is performed on the selected test page and the results of the test read of the selected test page are evaluated for read disturb noise.

20 Claims, 9 Drawing Sheets

| k | Read Count Threshold ($RC_k$) | Initial Test Page ($S_k$) |
|---|---|---|
| 1 | 1,023 | MSB Page 1 |
| 2 | 2,047 | MSB Page 2 |
| 3 | 3,071 | MSB Page 5 |
| 4 | 4,095 | MSB Page 6 |
| 5 | 5,119 | MSB Page 9 |
| 6 | 6,143 | MSB Page 10 |
| ⋮ | ⋮ | ⋮ |
| 61 | 62,463 | MSB Page 121 |
| 62 | 63,487 | MSB Page 122 |
| 63 | 64,511 | MSB Page 125 |
| 64 | 65,535 | MSB Page 126 |

550

| k | Read Count Threshold ($RC_k$) | Initial Test Page ($S_k$) |
|---|---|---|
| 1 | 511 | MSB Page 1 |
| 2 | 1,023 | MSB Page 2 |
| 3 | 3,071 | MSB Page 5 |
| 4 | 1,535 | MSB Page 6 |
| 5 | 2,047 | MSB Page 9 |
| 6 | 2,559 | MSB Page 10 |
| ⋮ | ⋮ | ⋮ |
| 61 | 31,231 | MSB Page 121 |
| 62 | 31,743 | MSB Page 122 |
| 63 | 32,255 | MSB Page 125 |
| 64 | 32,767 | MSB Page 126 |

FIG. 9 ical fields related to the
invention has not been described in detail so that the
invention is not unnecessarily obscured.

Figure 1:
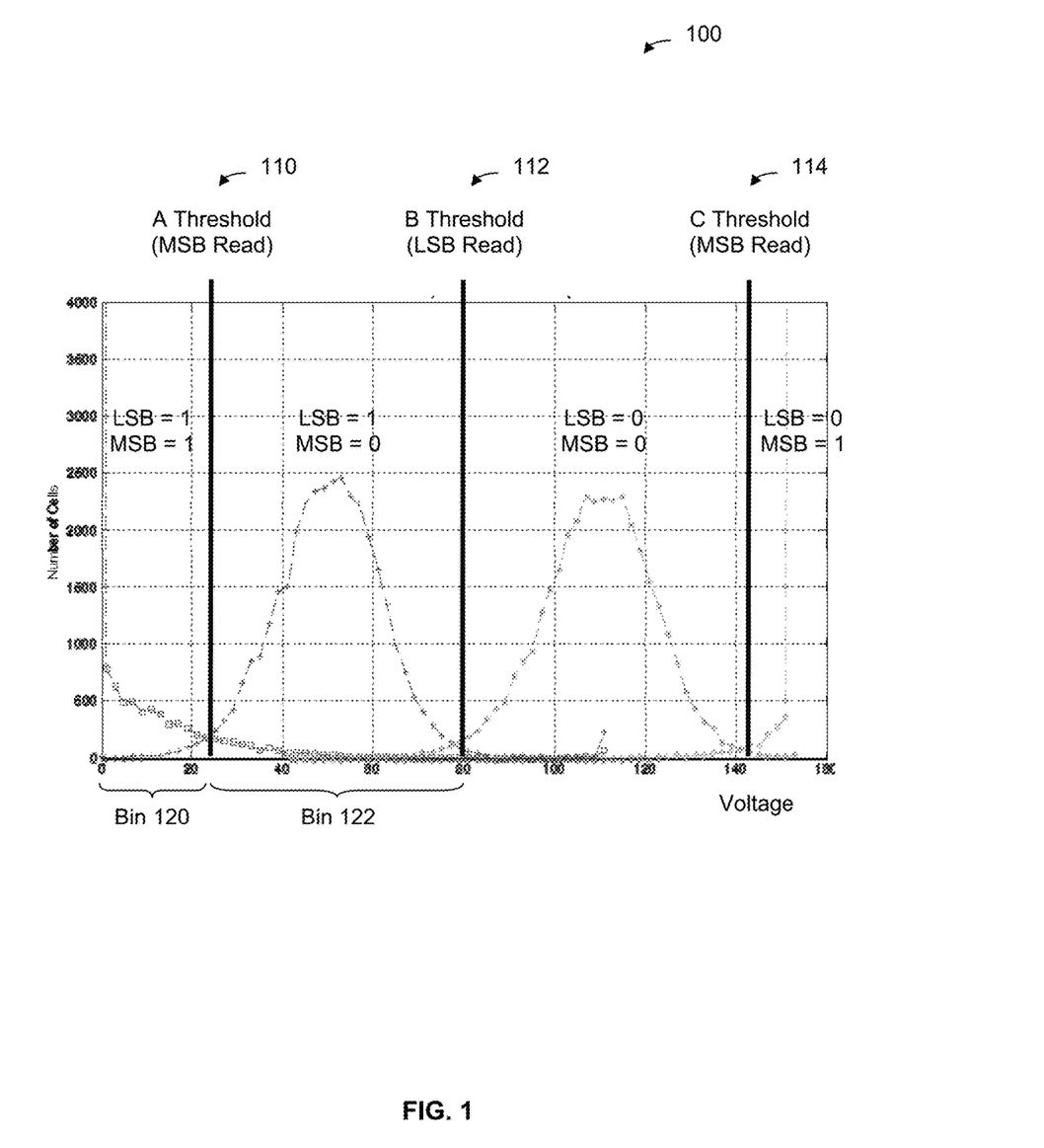
FIG. 1 is a diagram illustrating an example of a 2-bit,
multi-level cell (MLC) system which has read disturb noise.

FIG. 1 is a diagram illustrating an example of a 2-bit,
multi-level cell (MLC) system which has read disturb noise.
Diagram 100 shows an example distribution of voltages
stored by a group of cells. In the example shown, each cell
is configured to store 2 bits: a most significant bit (MSB) and
a least significant bit (LSB). When a cell is read, 3 thresholds
are used: A threshold 110, B threshold 112, and C threshold
114. The A and C thresholds are used to read the MSB. If the
voltage stored by the cell is less than A threshold 110 or is
greater than C threshold 114, then the MSB is read as a 1.
If the voltage is between A threshold 110 and C threshold
114, then the MSB is read as a 0. The B threshold is used to
read the LSB. If the voltage stored by the cell is less than B
threshold 112, then the LSB is read as a 1. If the voltage
stored by the cell is greater than B threshold 112, then the
LSB is read as a 0. Naturally, in some other embodiments,
the LSB and MSB may be swapped and/or some other bit
mapping may be used.

Read disturb noise tends to affect lower voltages, for
example those voltages stored by the cells in bin 120.
Consider a cell which has a voltage just less than A threshold
110 before some read disturb noise is added to that cell. With
the additional voltage from the read disturb noise, the
voltage of the cell will be pushed over the A threshold such
that that cell would now be in bin 122 and not bin 120. In
comparing the LSB and MSB values of bins 120 and bin
122, the LSB values are the same. The LSB is thus not
helpful in detecting read disturb noise since cells in bin 120
and 122 have the same LSB value. However, the MSB value
is different for cells in bin 120 compared to bin 122, and so
the MSB will be more useful in detecting read disturb noise.

Although some embodiments described herein show
2-bit, MLC examples, the techniques described herein are
applicable to solid state systems which store any number of
bits. For example, the techniques described herein work with
1-bit, single-level cell (SLC) systems as well as 3-bit,
tri-level cell (TLC) systems and so on.

Figure 2:
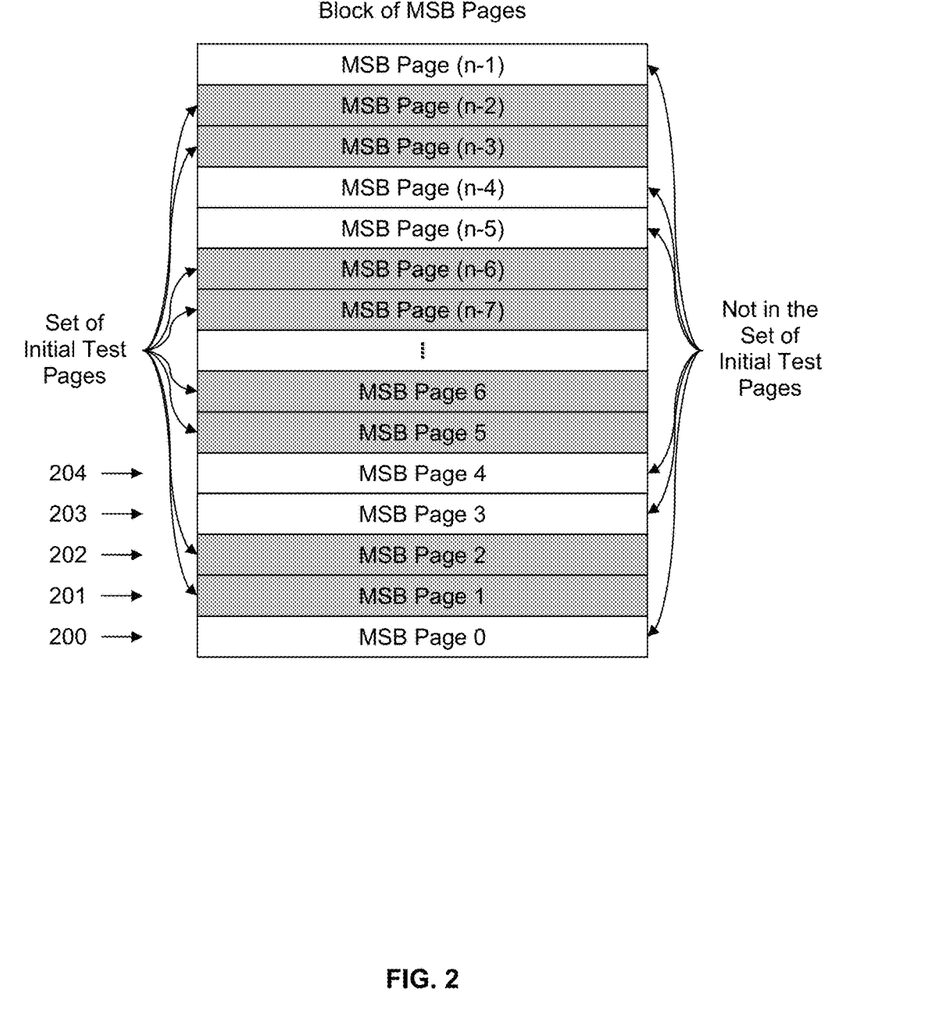
FIG. 2 shows an embodiment of a set of initial test pages
in a block.

FIG. 2 shows an embodiment of a set of initial test pages
in a block. This example shows an all bit-line structure
which has a single LSB page and a single MSB page per

READ DISTURB DETECTION

CROSS REFERENCE TO OTHER APPLICATIONS

This application claims priority to U.S. Provisional Patent
Application No. 61/994,691 entitled READ DISTURB
DETECTION filed May 16, 2014 which is incorporated
herein by reference for all purposes.

BACKGROUND OF THE INVENTION

Read disturb noise is a type of noise that is introduced
during the process of reading solid state storage (e.g.,
NAND Flash). During a read, the control gates of all cells in
the selected block (other than the cells being read) are biased
to a voltage (sometimes referred to as $V_{pass}$) which exceeds
the maximum voltage that any cell in the block may be
written to. In doing so, these cells are placed into the pass
state, in which they act as short-circuits, thus isolating only
the cells which are being read. An undesirable byproduct of
this biasing, however, is the application of additional electrons to the floating-gates of these cells. This unintentional
and additional voltage is referred to as read disturb. New
read disturb detection techniques which improve upon existing techniques (e.g., as measured by performance metrics
such as the amount of storage required, the maximum
amount of time it takes to check an entire block for read
disturb, and/or the number of additional, test reads consumed) would be desirable.

BRIEF DESCRIPTION OF THE DRAWINGS

Various embodiments of the invention are disclosed in the
following detailed description and the accompanying drawings.

DETAILED DESCRIPTION

The invention can be implemented in numerous ways,
including as a process; an apparatus; a system; a composition of matter; a computer program product embodied on a
computer readable storage medium; and/or a processor, such
as a processor configured to execute instructions stored on
and/or provided by a memory coupled to the processor. In
this specification, these implementations, or any other form
that the invention may take, may be referred to as techniques. In general, the order of the steps of disclosed
processes may be altered within the scope of the invention.
Unless stated otherwise, a component such as a processor or
a memory described as being configured to perform a task
may be implemented as a general component that is temporarily configured to perform the task at a given time or a
specific component that is manufactured to perform the task.
As used herein, the term 'processor' refers to one or more
devices, circuits, and/or processing cores configured to
process data, such as computer program instructions.

A detailed description of one or more embodiments of the
invention is provided below along with accompanying figures that illustrate the principles of the invention. The
invention is described in connection with such embodiments, but the invention is not limited to any embodiment.
The scope of the invention is limited only by the claims and
the invention encompasses numerous alternatives, modifications and equivalents. Numerous specific details are set
forth in the following description in order to provide a
thorough understanding of the invention. These details are
provided for the purpose of example and the invention may
be practiced according to the claims without some or all of
these specific details. For the purpose of clarity, technical
material that is known in the techn word line. For the reasons described above, MSB pages are tested in order to detect read disturb and LSB pages are not tested (at least in this MLC example). In the example shown, the block begins (ends) with a single MSB page which is not in the set of initial test pages (shown in white), followed by 2 MSB pages which are in the set (shown in grey), followed by 2 MSB pages which are not in the set, and so on. The set of initial test pages is referred to as such because those pages are the ones that are tested at first. If read disturb noise is detected, then a related page (which may not necessarily be in the set of initial test pages) may be tested for read disturb noise. To put it another way, a page that is not in the set of initial test pages (e.g., MSB page 0 (200)) is not excluded from read disturb testing per se, but rather is not tested at least at first.

When a read (e.g., initiated by a host) is performed on a given page, the pages above and below are the most vulnerable to read disturb noise. For example, if MSB page 0 (200) is read, MSB page 1 (201) may receive the most read disturb noise. Similarly, if MSB page 1 (201) is read, MSB page 0 (200) and MSB page 2 (202) may receive the worst read disturb noise. (The directly adjacent pages of the page being read are the most affected and thus in embodiments described herein they are the ones tested and corrected, if needed. Naturally, in some embodiments, pages that are not directly adjacent are tested and/or corrected, if needed.

One way of evaluating the arrangement of initial test pages shown is to consider if read disturb noise would be able to be detected if a same page were read over and over (e.g., causing read disturb noise on the page directly above and the page directly below) using the arrangement shown. The arrangement of initial test pages shown will catch at least one of the two pages that are adjacent to a page being repeatedly read. For example, if MSB page 0 (200) is repeatedly read, then MSB page 1 (201) will eventually be selected and tested. If MSB page 1 (201) is repeatedly read, then MSB page 2 (202) will eventually be selected and tested. If MSB page 2 (202) is repeatedly, then MSB page 1 (201) will eventually be selected and tested, and so on. Once read disturb noise is detected in one of the initial test page, detection may be initiated for other MSB pages (e.g., which may not necessarily be in the set of initial test pages). An example of such a detection process is described in more detail below.

Although the block could begin or end with two pages in the set of initial test pages, in some applications it is desirable to begin and end with a single page that is excluded from the set of initial test pages as is shown in this example. This is because the edge pages tend to have half as much read disturb noise as the other pages. MSB page 0 (200), for example, will only have read disturb noise from MSB page 1 (201) since there is no page below MSB page 0 (200). As such, a read disturb detection process either has to account for this (which is undesirable since it requires extra logic) or the edge pages would be less likely to have read disturb noise detected within since they may not have enough extra charge to trigger some flag or threshold (perhaps even in cases when those pages should be flagged, which is undesirable).

One benefit to performing read disturb detection using the example set of initial test pages shown is that fewer reads are required to test a block in its entirety. Some other techniques, for example, may test all n MSB pages instead of only testing (initially at least) n/2 pages as is shown here. In addition to reducing the amount of test time, fewer test reads means that less read disturb noise is introduced into the system. A test read is still a read and so performing fewer test reads introduces less read disturb noise into the page directly above or below the page being tested. Fewer test reads also means that accesses by the host are less likely to be impeded or otherwise delayed by a test read.

This example shows the minimum number of initial test pages in a block which provide sufficient test coverage. In some embodiments, some other set of initial test pages (e.g., other than that shown in FIG. 2) may be used even though it may be less optimal than the pattern shown in FIG. 2. For example, a block may have 1-3 ((not in set)-(in set)) pattern instead of the 2-2 pattern shown herein. Although 75% of the pages would be tested during each pass of the block, it would still offer some savings over testing all of the pages.

The following figure describes a read disturb detection process which uses the set of initial test pages shown here. Naturally, some other read disturb detection processes may be performed using the set of initial test pages shown.

Figure 3:
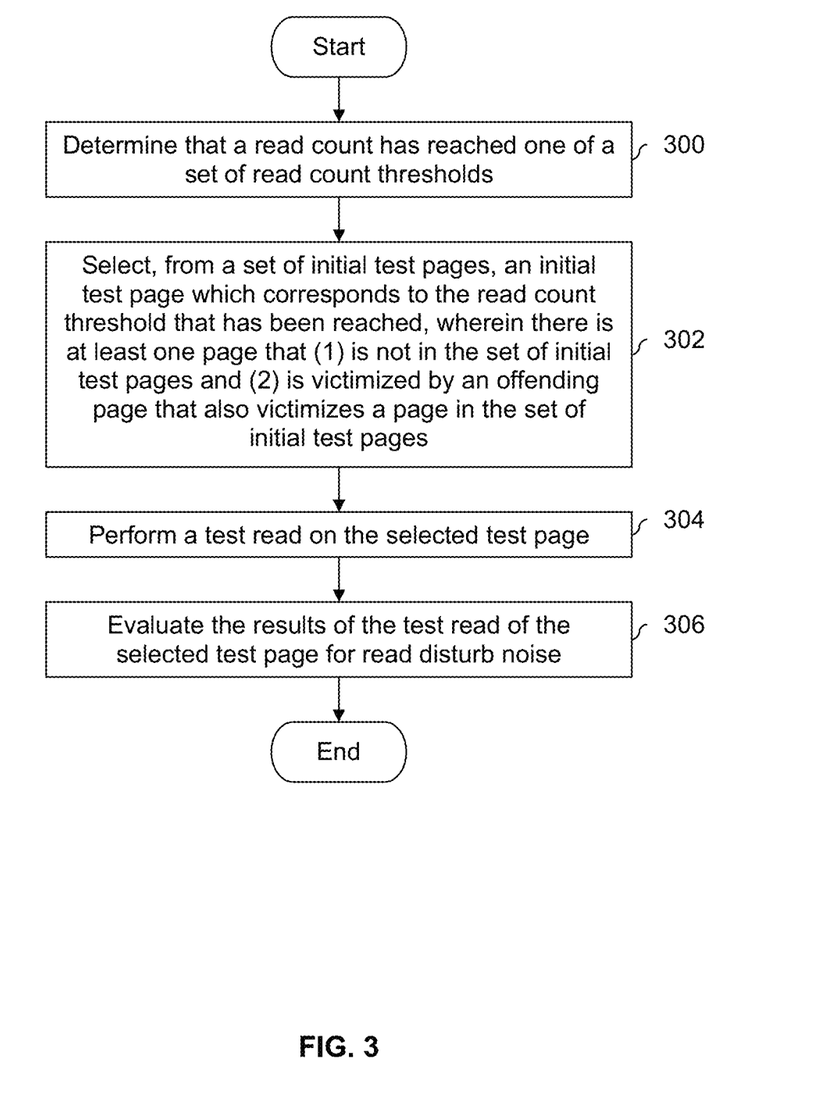
FIG. 3 is a flowchart illustrating an embodiment of a read
disturb detection process.

FIG. 3 is a flowchart illustrating an embodiment of a read disturb detection process. In some embodiments, the process is performed by a storage controller, for example implemented in an application-specific integrated circuit (ASIC) or a field-programmable gate array (FPGA). The storage controller, for example may be one semiconductor "chip" which controls one or more other semiconductor "chips" that contain the solid state storage.

At 300, it is determined that a read count has reached one of a set of read count thresholds. For example, the set of read count thresholds may be {1,023; 2,047; . . . ; 64,511; 65,535} and so if the read count hits any of those thresholds, step 200 would have been satisfied or otherwise performed. In another example, the set of read count thresholds is {511; 1,023; . . . , 32,255; 32,767}.

In some embodiments, a read counter is associated with a group of blocks in order to keep the amount of storage used to implement the read counters to an acceptable amount. The following figure shows some example groups of blocks for which a single read counter is used.

Figure 4:
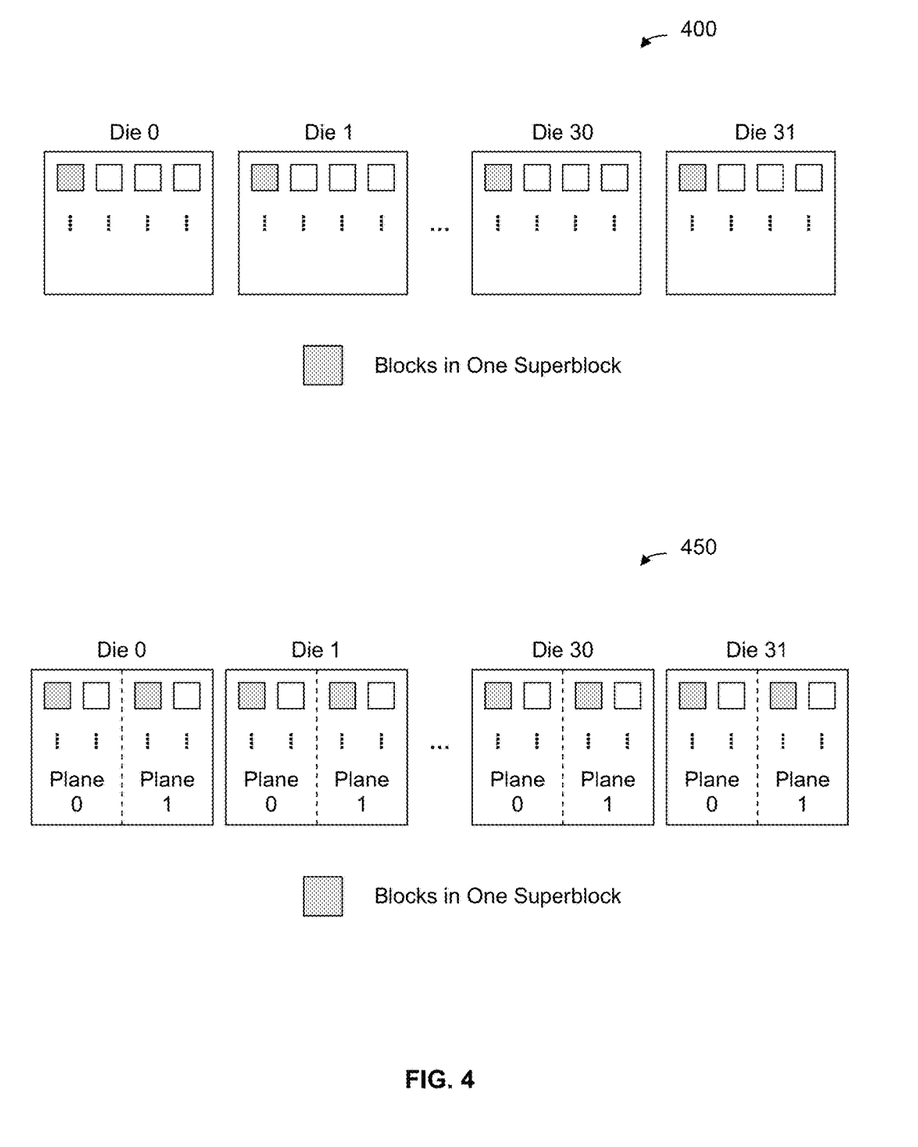
FIG. 4 shows some embodiments of blocks in a group for
which a single read counter is used.

FIG. 4 shows some embodiments of blocks in a group for which a single read counter is used. Diagram 400 shows an example of blocks in a superblock where the die are single-plane die. In some systems, including the one shown, blocks from different die are able to be read simultaneously (i.e., in parallel); this is desirable since it improves the overall throughput of the storage system. Such a group of blocks is sometimes referred to as a superblock and the grey blocks in diagram 400 show blocks in one superblock. In some embodiments, a single read counter (e.g., at step 300 in FIG. 3) is used to count the number of reads associated with blocks in a superblock.

Diagram 450 shows an example of blocks in a superblock where the die are dual-plane die. In a dual-plane die, one block from each plane may be read simultaneously. As such, even though diagrams 400 and 450 show the same number of die (i.e., 32), the number of blocks in the superblock of diagram 400 is 32 compared to 64 in diagram 450.

Alternatively, in some embodiments a group (i.e., for which a single read counter is used) comprises dual plane blocks in a die (e.g., as opposed to a superblock).

Although a read controller may choose to read all blocks in a given group simultaneously, the read controller is not necessarily required to do so. In some embodiments, a read counter increments by one if all blocks in a given group are read simultaneously. In some embodiments, even if only one block in a given group is read, the read counter is (also) incremented by one.

Returning to FIG. 3, at 302, an initial test page which corresponds to the read count threshold that has been reached is selected from a set of initial test pages where there is at least one page that (1) is not in the set of initial test pages and (2) is victimized by an offending page that also victimizes a page in the set of initial test pages.

In one example of a page that is not in the set of initial test pages and is also victimized by an offending page that also victimizes a page in the set of initial test pages (e.g., described in step 302), consider the example of FIG. 2. MSB page 0 (200) not in the set of initial test pages. Also, both MSB page 0 (200) and MSB page 2 (202), which is in the set of initial test pages, are both victimized by MSB page 1 (201). Thus, MSB page 0 (200) is one example of a page that meets the two characteristics described in step 302. In another example, MSB page 3 (203) also meets the two characteristics described in step 302. MSB page 3 (203) is (1) not in the set of initial test pages and (2) both it and MSB page 1 (201), which is in the set of initial test pages, are victimized by the same page: MSB page 2 (202).

In some applications, having at least one page that satisfies the two characteristics described in step 302 is desirable because it reduces the number of (MSB) pages which are tested at least initially (e.g., at least until read disturb noise is actually detected in one of the pages of the block). Reducing the number of pages which are tested (at least initially) is desirable, for example because of issues related to power consumption, interference with host access to the solid state storage, the amount of time to check an entire block, etc.

In some embodiments, a table is used to select the initial test page at step 302. The following figure describes one example of such a table.

Figure 5:
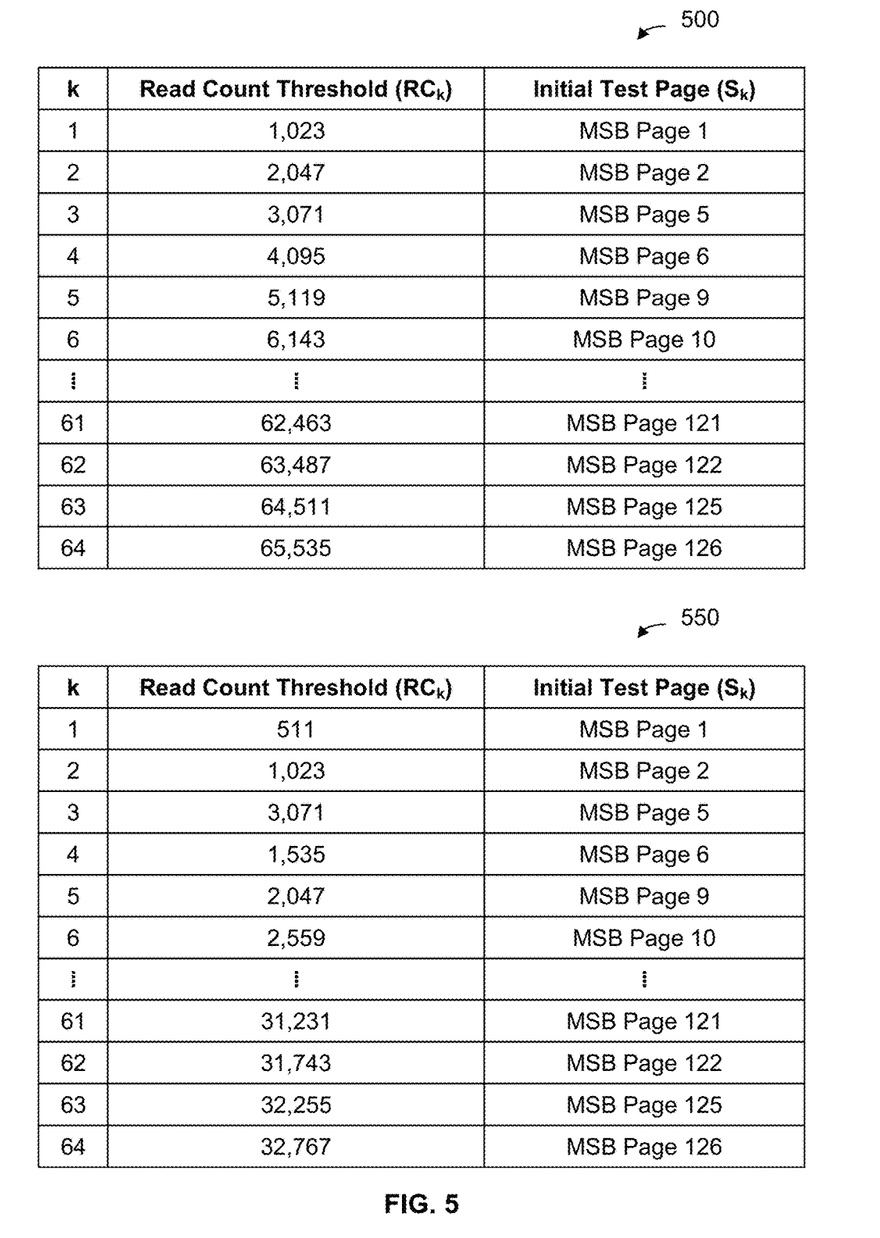
FIG. 5 is a diagram illustrating an embodiment of a table
of read count thresholds and corresponding initial test pages.

FIG. 5 is a diagram illustrating an embodiment of a table of read count thresholds and corresponding initial test pages. Table 500 shows a table where a test read is performed every time the read count reaches a multiple of 1,023. When the read count reaches 1,023, MSB page 1 is selected; when the read count reaches 2,047, MSB page 2 is selected; and so on. In this particular example, each block includes 128 MSB pages and the entire block is checked every time the read count reaches 65,535. In this particular example, the read counter will reset to 0 when it reaches 65,535.

Table 550 shows a similar table where the test reads are performed more frequently. In this example, a test read is performed every time the read count reaches a multiple of 511. When the read count reaches 511, MSB page 1 is selected as the test page; when the read count reaches 1,023, MSB page 2 is selected as the test page; and so on. The entire block is thus checked every time the read count reaches 32,767 (i.e., in half the time than if table 500 were used). In this particular example, the read counter will reset to 0 when it reaches 32,767.

Suppose that $N_g$ is the number of blocks within a group (e.g., $N_g$=32 in diagram 400 in FIG. 4 and $N_g$=64 in diagram 450), $N_b$ is the number of bits used for a single read counter (e.g., $N_b$=16 in diagram 500 because 16 bits are required to count to 65,535 and $N_b$=15 in diagram 550 because 15 bits are required to count to 32,767), and B is the total number of blocks in a storage device. If so, the amount of storage required to implement the read counters according to this technique is $(N_b \times B)/N_g$. If, in a particular application, it is desired to use less storage for the read counters, then $N_g$ may be increased and/or $N_b$ may be decreased.

Returning to FIG. 3, at 304, a test read is performed on the selected test page. In some embodiments, a test read is performed opportunistically, for example when there are no pending host access requests. At 306, the results of the test read of the selected test page are evaluated for read disturb noise. The following figure describes one example of how step 306 may be performed.

Figure 6:
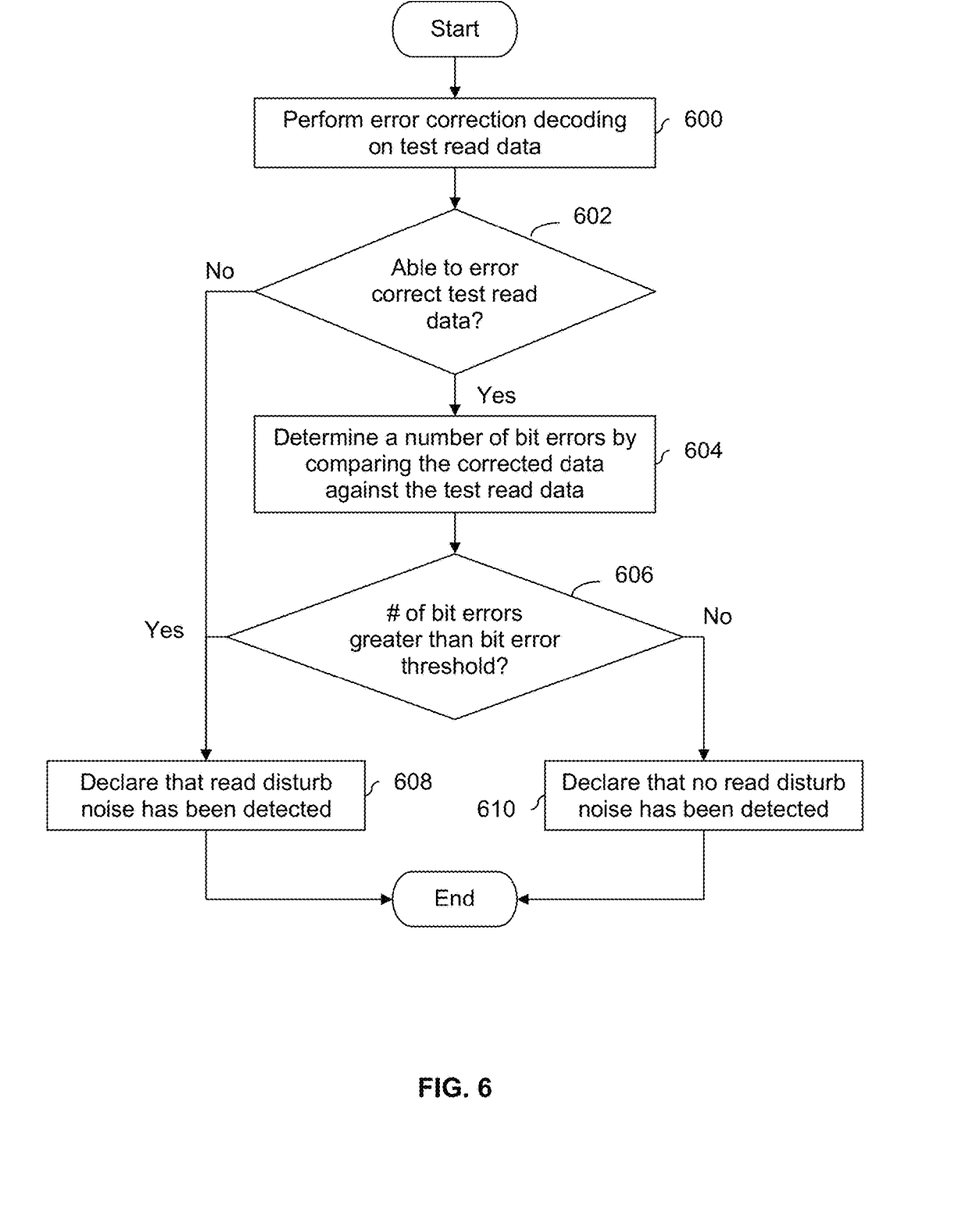
FIG. 6 is a flowchart illustrating an embodiment of a
process for evaluating the results of a test read for read
disturb noise.

FIG. 6 is a flowchart illustrating an embodiment of a process for evaluating the results of a test read for read disturb noise. In some embodiments, the process is used at step 306 in FIG. 3. At 600, error correction decoding is performed on the test read data. For example, a BCH code or a low-density parity-check (LDPC) code may be used. At 602, it is determined if the test read data is able to be error corrected. For example, if the number of bit errors contained within the test read data is greater than the error correction capability of a code (e.g., the maximum number of bit errors the code is able to fix), then the code is not able to correct the test read data. Some codes may use one or more parity checks to make the determination at step 602.

If it is determined at step 602 that the test read data is not able to be error corrected, then it is declared that read disturb noise has been detected at 608. Otherwise, a number of bit errors is determined by comparing the corrected data against the test read data at 604. For example, any bits that have flipped in value (e.g., from 0 to 1 or from 1 to 0) between the test read data and the corrected data would be counted as an error.

It is determined at 606 if the number of bit errors is greater than a bit error threshold. If so, it is declared at 608 that read disturb noise has been detected. If not, it is declared at 610 that no read disturb noise has been detected.

If read disturb noise is detected, a variety of subsequent processing may be triggered. The following figure is one example of such subsequent processing.

Figure 7:
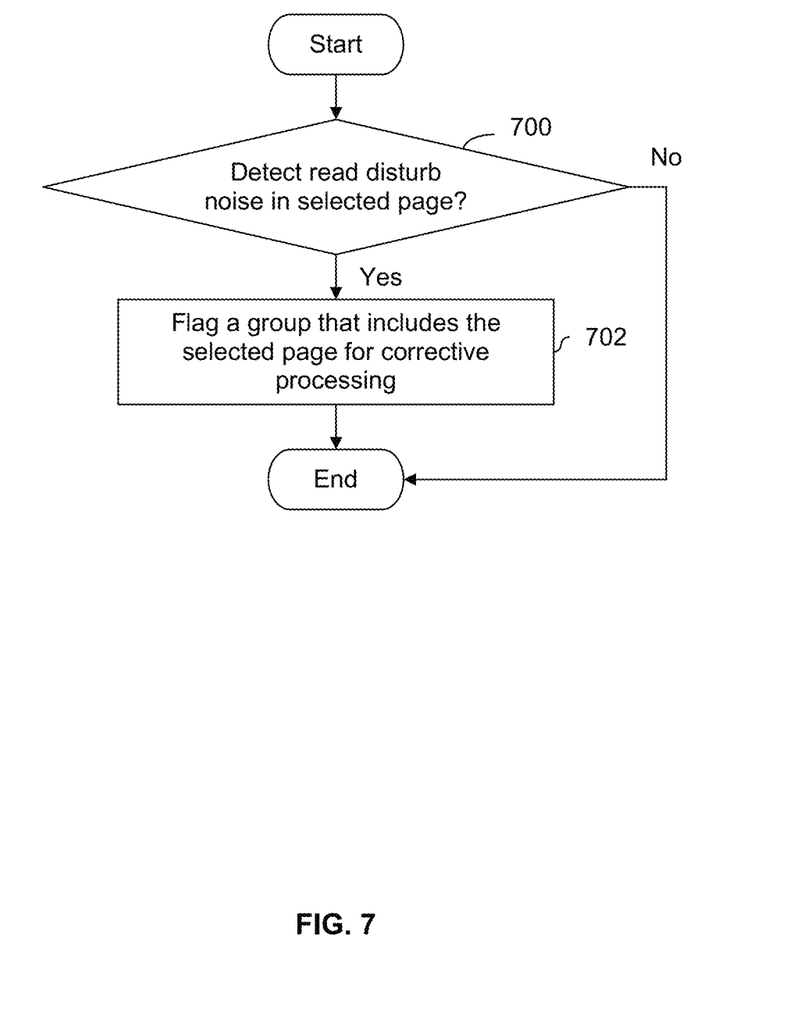
FIG. 7 is a flowchart illustrating an embodiment of a
process for subsequent processing in the event read disturb
noise is detected.

FIG. 7 is a flowchart illustrating an embodiment of a process for subsequent processing in the event read disturb noise is detected. In some embodiments, the process of FIG. 7 is performed after the process of FIG. 3.

At 700, it is determined if read disturb noise has been detected in the selected page. If read disturb noise has not been detected in the selected page, the process ends. Otherwise, a group that includes the selected page is flagged for corrective processing at 702. In various embodiments, the group flagged at 702 may comprise a superblock, a group of blocks (e.g., other than a superblock), a group of pages, etc. The techniques described herein are directed to read disturb detection (not correction) and so any appropriate corrective processing technique may be used. In some embodiments, a superblock that contains the page is flagged for garbage collection where the data is moved to another location by a garbage collection process. In some embodiments, the page is so worn out that it is no longer used to store data and the page number or location is recorded in a "do not use" list of pages.

Returning to FIG. 2, although having a scheduled and/or pre-defined order in which pages are (initially) tested, it would be desirable if test pages could be selected in a more intelligent manner. The following figure describes one example which may (at least in some cases) reduce the amount of time it takes to detect read disturb noise.

Figure 8:
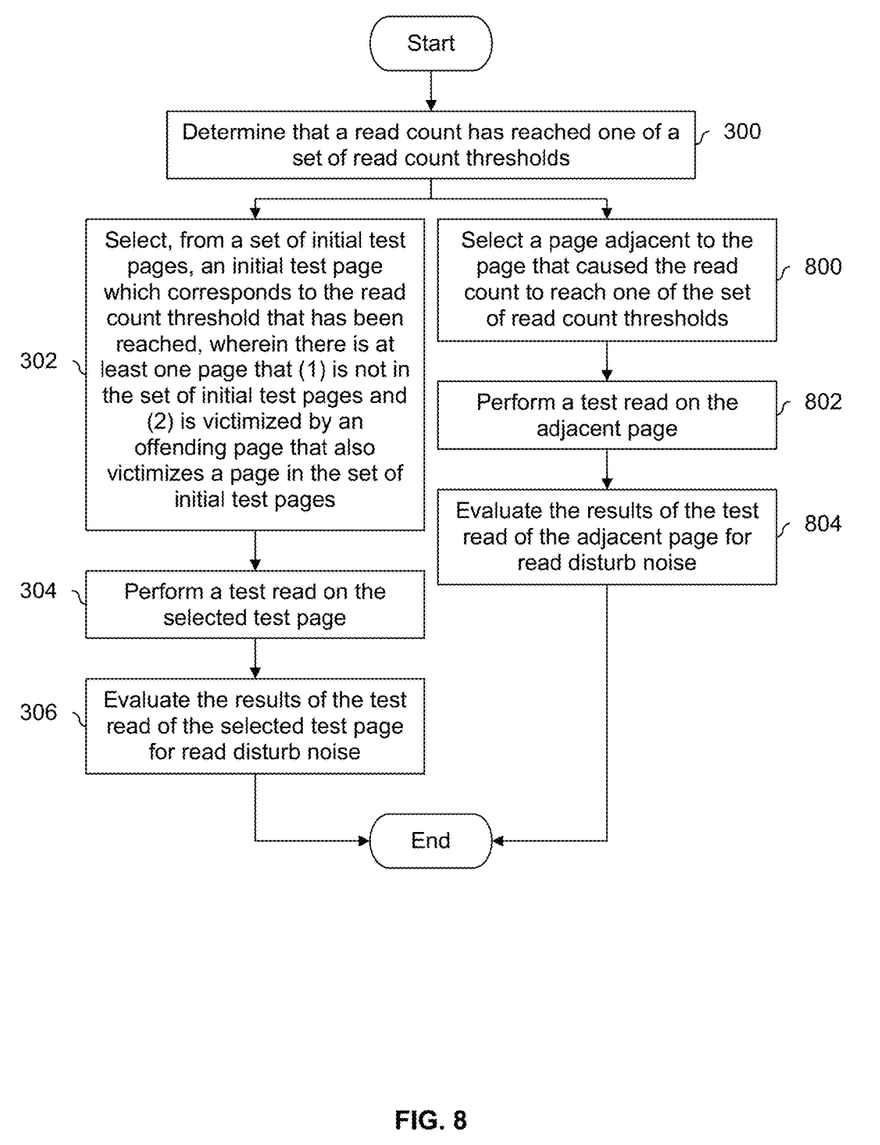
FIG. 8 is a flowchart illustrating an embodiment of a read
disturb detection process, where both a scheduled page and
a page adjacent to a last read are tested.

FIG. 8 is a flowchart illustrating an embodiment of a read disturb detection process, where both a scheduled page and a page adjacent to a last read are tested. The example of FIG. 8 is similar to that shown in FIG. 3 and the same references numbers are used to indicate identical steps. For brevity, the descriptions of steps 300, 302, 304, and 306 are not repeated since they have already been described above. In this technique, in addition to a scheduled page being tested (e.g., per diagram 500 in FIG. 5, MSB page 1 is scheduled to be tested at a read count of 1,023; MSB page 2 is scheduled to be tested at a read count of 2,047; and so on), a page adjacent to a last read are tested. From a memory point of view, this technique is attractive because the amount of (additional or new) storage required to implement the process is relatively minimal.

At 800, a page adjacent to the page that caused the read count to reach one of the set of read count thresholds is selected. For example, suppose that MSB page 3 (203) in FIG. 2 is the location that caused the read count to hit 62,463 (where in this example, 62,463 is one of the read count thresholds). In this case, either MSB page 4 (204) or MSB page 2 (202) would be selected since they are adjacent to MSB page 3 (203) (i.e., the page that caused the read count to reach one of the read count thresholds). Note that the adjacent page at step 800 does not have to be in the set of initial test pages.

At 802, a test read is performed on the adjacent page. As with a test read of a scheduled page, the test read at step 802 may be performed opportunistically (e.g., when there is no pending host access) and/or by a storage interface in a storage controller.

At 804, the results of the test read of the adjacent page are evaluated for read disturb noise. In some embodiments, FIG. 6 is used at step 804.

Using the process of FIG. 8 may enable read disturb noise to be detected sooner than if pages are tested only according to a predetermined schedule. In diagram 500 of FIG. 5, for example, the worst case scenario is that it will take a read count of 65,535 before read disturb noise is detected. Testing a page adjacent to a last read page (i.e., the one that caused the read count to reach one of the read count thresholds in the set of read count thresholds) in addition to a scheduled test page can only help to reduce the amount of time it takes to detect read disturb noise.

In particular, the process of FIG. 8 may be attractive when storage controllers are being evaluated by systems manufacturers (e.g., when they are deciding what storage controller to include in their product). Some systems manufacturers will read the same page over and over again as part of their test suite and being able to detect read disturb noise faster than other storage controllers would be desirable. In another example, a user may store songs on solid state storage. If the user has one song in particular that she likes, she may listen to that song over and over, which corresponds to reading the same pages over and over. Using the process of FIG. 8 may enable read disturb noise to be detected faster in such environments where the same file or object is read over and over again faster compared to the process of FIG. 3.

Figure 9:
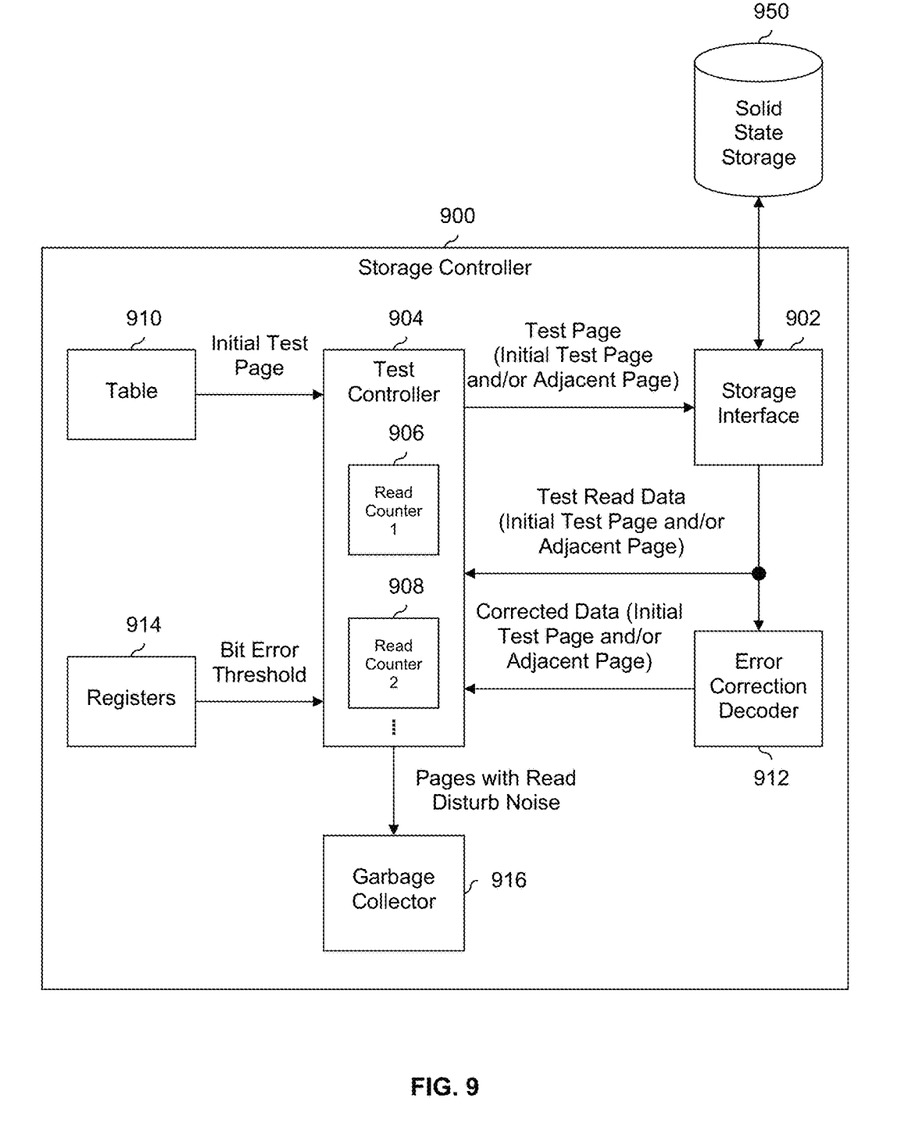
FIG. 9 is a diagram illustrating an embodiment of a solid
state storage system.

FIG. 9 is a diagram illustrating an embodiment of a solid state storage system. Storage controller 900 is one embodiment of a system which performs the techniques described herein. In some embodiments, storage controller 900 is implemented on a semiconductor device, such as an ASIC or FPGA.

Test controller 904 includes a plurality of read counters, including read counters 906 and 908. Each read counter in this example is associated with a different group of blocks for which reads to those groups of blocks is being tracked. For example, the first read counter (906) counts reads to a first group of blocks on solid state storage 950 and the second read counter (908) counts reads to a second group of blocks on solid state storage 950. For readability, solid state storage 950 is shown in this figure as a single device or component, but in some embodiments it may include multiple devices or multiple components (see, e.g., FIG. 4).

When one of read counters 906 or 908 reaches a read count threshold, test controller 904 obtains the initial test page that corresponds to that particular read count threshold from table 910 (e.g., the one scheduled for that particular read count threshold). FIG. 5 shows some embodiments of table 910.

The initial test page is passed from test controller 904 to storage interface 902 where storage interface 902 performs a test read on the specified test page. In some embodiments, in addition to testing an initial test page, a page adjacent to adjacent to the page that caused the read count to reach one of the set of read count thresholds is also tested. See, for example, the process of FIG. 8.

The test read data for the initial test page and/or the adjacent page are passed from storage interface 902 to error correction decoder 912 and test controller 904. Error correction decoder 912 (e.g., an LDPC decoder or a BCH decoder) performs error correction decoding on the test read data and sends the corrected data (assuming the test read data is able to be corrected) to test controller 904. Test controller 904 uses the (uncorrected) test read data from storage interface 902 and the corrected data from error correction decoder 912 to determine a number of bit errors. If the number of bit errors exceeds a bit error threshold (obtained from registers 914, which are programmable), then the test controller flags the tested page (e.g., the initial test page or the adjacent page) as having read disturb noise. If error correction decoder 912 in this example is not able to perform error correction decoding on the test page, then test controller 904 declares that those pages have read disturb noise.

Test controller 904 identifies the pages with read disturb noise to garbage collector 916, which performs corrective processing on those pages (e.g., by copying the data, with or without error correction decoding, to a new location). Naturally, if some other corrective processes are performed (e.g., in addition to or as an alternative to garbage collection) then test controller 904 would identify the pages with read disturb noise to those components.

In some embodiments, registers 914 includes a period associated with the test count thresholds. For example, to implement table 500 shown in FIG. 5, registers 914 may have a value of RC=1,023. To implement table 550 shown in FIG. 5, registers 914 may have a value of RC=511.

In some embodiments, the sequence in which test pages appear in table 910 are configurable via registers 914. In one example, to implement the order of test pages shown in table 500 and 550 (they are the same sequence), the first bit in a bit array associated with MSB page 1 is asserted, the second bit in a bit array associated with MSB page 2 is asserted, the third bit in a bit array associated with MSB page 5 is asserted, and so on. In some embodiments, to save space, only half of the pages are able to be included in a table. For example, using FIG. 2 as a reference, only the grey pages shown would be able to be included in table 910 using registers 914, but the sequence in which those pages are listed may be controlled via registers 914.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:
1. A system, comprising:
a test controller configured to:

determine that a read count of a block has reached one of a set of read count thresholds for the block, each read count threshold of the set of thresholds corresponding to an initial test page in a set of initial test pages; and select, from the set of initial test pages, the initial test page which corresponds to the reached read count threshold, and a memory interface configured to perform a test read on the selected test page;

the test controller further configured to evaluate results of the performed test read on the selected initial test page for read disturb noise;

wherein the initial test pages in the set of initial test pages are configured to be tested first in test reads that evaluate read disturb noise, and wherein each page in the set of initial test pages victimizes a page not included in the set of initial test pages and victimizes another page included in the set of initial test pages.

2. The system recited in claim 1, wherein the system includes a semiconductor device, including one or more of the following: an application-specific integrated circuit (ASIC) or a field-programmable gate array (FPGA).

3. The system recited in claim 1, further comprising a solid state storage, wherein:
a first semiconductor device includes the test controller and the memory interface; and
the solid state storage is located at least in part on a second semiconductor device.

4. The system recited in claim 3, further comprising a plurality of blocks, wherein the plurality of blocks is able to be accessed simultaneously.

5. The system recited in claim 1, wherein the test controller is configured to evaluate, including by:
performing error correction decoding on test read data from the performed test read;
determining a number of bit errors by comparing corrected data from the performed error correction decoding against the test read data;
determining if the number of bit errors is greater than a bit error threshold; and
when it is determined that the number of bit errors is greater than the bit error threshold, declaring that read disturb noise has been detected.

6. The system recited in claim 1, further comprising a garbage collector configured to perform garbage collection on a group that includes the selected page when read disturb noise is detected in the selected initial test page.

7. A method, comprising:
determining that a read count of a block has reached one of a set of read count thresholds for the block, each read count threshold of the set of thresholds corresponding to an initial test page in a set of initial test pages;
selecting, from the set of initial test pages, the initial test page which corresponds to the reached read count threshold;
performing a test read on the selected initial test page; and
using a processor to evaluate results of the performed test read on the selected test page for read disturb noise,
wherein the initial test pages in the set of initial test pages are configured to be tested first in test reads that evaluate read disturb noise; and
wherein each page in the set of initial test pages victimizes a page not included in the set of initial test pages and victimizes another page included in the set of initial test pages.

8. The method recited in claim 7, wherein the processor includes a semiconductor device, including one or more of the following: an application-specific integrated circuit (ASIC) or a field-programmable gate array (FPGA).

9. The method recited in claim 7, wherein the read count is associated with a plurality of blocks in solid state storage.

10. The method recited in claim 9, wherein the plurality of blocks is able to be accessed simultaneously.

11. The method recited in claim 7, wherein evaluating includes:
performing error correction decoding on test read data from the performed test read;
determining a number of bit errors by comparing corrected data from the performed error correction decoding against the test read data;
determining if the number of bit errors is greater than a bit error threshold; and
when it is determined that the number of bit errors is greater than the bit error threshold, declaring that read disturb noise has been detected.

12. The method recited in claim 7, further comprising: when read disturb noise is detected in the selected page, performing garbage collection on a group that includes the selected initial test page.

13. A computer program product, the computer program product being embodied in a non-transitory computer readable storage medium and comprising computer instructions for:
determining that a read count of a block has reached one of a set of read count thresholds for the block, each read count threshold of the set of thresholds corresponding to an initial test page in a set of initial test pages;
selecting, from the set of initial test pages, the initial test page which corresponds to the reached read count threshold;
performing a test read on the selected initial test page; and
evaluating results of the performed test read on the selected test page for read disturb noise;
wherein the initial test pages in the set of initial test pages are configured to be tested first in test reads that evaluate read disturb noise; and
wherein each page in the set of initial test pages victimizes a page not included in the set of initial test pages and victimizes another page included in the set of initial test pages.

14. The computer program product recited in claim 13, wherein the read count is associated with a plurality of blocks in solid state storage.

15. The computer program product recited in claim 14, wherein the plurality of blocks is able to be accessed simultaneously.

16. The computer program product recited in claim 13, wherein the computer instructions for evaluating include computer instructions for:
performing error correction decoding on test read data from the performed test read;
determining a number of bit errors by comparing corrected data from the performed error correction decoding against the test read data;
determining if the number of bit errors is greater than a bit error threshold; and
when it is determined that the number of bit errors is greater than the bit error threshold, declaring that read disturb noise has been detected.

17. The computer program product recited in claim 13 further comprising computer instructions for: when read disturb noise is detected in the selected page, performing garbage collection on a group that includes the selected initial test page.

18. The system of claim 1, wherein the page in the set of initial test pages that victimizes the page not included in the set of initial test pages and victimizes the other page included in the set of initial test pages is directly adjacent to both victimized pages.

19. The method of claim 7, wherein the page in the set of initial test pages that victimizes the page not included in the set of initial test pages and victimizes the other page included in the set of initial test pages is directly adjacent to both victimized pages.

20. The computer program product of claim 13, wherein the page in the set of initial test pages that victimizes the page not included in the set of initial test pages and victimizes the other page included in the set of initial test pages is directly adjacent to both victimized pages.

* * * * *